United States Patent [19]
Humphrey

[11] Patent Number: 5,904,288
[45] Date of Patent: May 18, 1999

[54] WIRE BOND CLAMPING METHOD

[75] Inventor: Henry L. Humphrey, The Colony, Tex.

[73] Assignee: Texas Instruments Incorporated, Dallas, Tex.

[21] Appl. No.: 08/841,970

[22] Filed: Apr. 8, 1997

Related U.S. Application Data

[60] Provisional application No. 60/014,964, Apr. 8, 1996.

[51] Int. Cl.⁶ .................................................... H01L 21/60
[52] U.S. Cl. ........................................ 228/180.5; 228/212
[58] Field of Search ................................. 228/180.5, 212, 228/4.5, 44.7, 49.5

[56] References Cited

U.S. PATENT DOCUMENTS

| | | | |
|---|---|---|---|
| 3,995,845 | 12/1976 | Scheffer | 228/44.7 |
| 5,035,034 | 7/1991 | Cotney | 228/4.5 |
| 5,197,652 | 3/1993 | Yamazaki | 228/44.7 |
| 5,673,845 | 10/1997 | Ball | 228/44.7 |

*Primary Examiner*—Samuel M. Heinrich
*Attorney, Agent, or Firm*—Alan K. Stewart; Wade James Brady, III; Richard L. Donaldson

[57] ABSTRACT

A method of bonding wires which includes providing at least a first and second pair of bonding locations, one of each pair of bonding locations being subject to flexure in response to the application of a force thereagainst. A clamping force is applied against at least one of the bonding locations subject to flexure and a wire bond is formed to the first bonding locations subject to flexure. The clamping force is removed from the first bonding location subject to flexure and a clamping force is applied against the second of the bonding locations subject to flexure. A wire bond is formed to the second of the bonding locations subject to flexure and the clamping force is removed from the second of the bonding locations subject to flexure. The bonding steps include providing a first capillary and causing the first capillary to perform the step of bonding in a predetermined direction and providing a second capillary and causing the second capillary to perform the step of bonding in a direction normal to the predetermined direction. Preferably there are a plurality of first pairs of bonding locations and a plurality of second pairs of bonding locations.

6 Claims, 1 Drawing Sheet

WIRE BOND CLAMPING METHOD

CROSS-REFERENCE TO RELATED APPLICATION

This application claims the benefit of provisional patent application Serial No. 60/014,964, file Apr. 8, 1996, now abandoned.

BACKGROUND OF THE INVENTION

1. Field of the Invention

This invention relates to a method of clamping wires during wire bonding operations in the fabrication of semiconductor circuits.

2. Brief Description of the Prior Art

In the fabrication of semiconductor devices, wiring between two bond pads on a chip or between a bond pad on the chip and an external bonding location, such as a lead frame, is generally performed by making a ball bond on one bonding pad at one end of a wire fed from a spool and a stitch bond at the other end of the wire. The wire is also severed from the spool from which it has been fed at the stitch bond location. Such bonding and wire severing is generally performed with the aid of a capillary through which the wire to be bonded is passed from the wire spool. The procedure is to form a ball from a portion of the wire which extends out of the capillary, bond the ball to a bond pad and move the capillary to the second bond pad with the wire being fed out through the capillary during travel of the capillary to the second bond pad. The wire is then stitch bonded to the second pad, usually a lead finger, and prepared for severing from the spool, using the tip of the capillary to perform these tasks.

In order for the capillary to perform the function of stitch bonding, the capillary must apply a force against the wire which rests on the bond pad/lead frame. In order to perform this task without fracture of the capillary, as a first condition, the capillary wall must have sufficient thickness to withstand the forces applied thereto at the location of force application during the stitch bonding procedure. This has been accomplished in the prior art by providing a wire bonding capillary with central bore or aperture, a circular cross section and wall thickness from exterior surface to central bore sufficient to accomplish the above described purpose and withstand the forces thereon.

With the continual decrease in the spacing dimensions between wire bonding locations, particularly in the semiconductor art, the problem of bonding wire to a wire bonding surface with a capillary and then moving the capillary to a new location without interference with adjacent wire bonding locations and wires bonded at adjacent wire bonding locations has become an increasing problem. As the dimensions decrease, the possibility that the capillary will interfere with or strike an adjacent bond pad or wire extending from an adjacent bond pad in its travel from one bonding location to a second bonding location increases.

A prior art technique that has been developed to accommodate and/or minimize this problem has utilized a capillary with the diameter of the tip portion decreased. This results in a reduction of capillary wall thickness and provides a poor stitch bond. Accordingly, this technique is undesirable.

A further prior art technique that has been developed to accommodate and/or minimize this problem has utilized a wire bonding capillary of circular cross section with a portion of the capillary wall on a pair of opposing sides of the capillary removed to provide an indentation thereat. Capillaries of this type are provided by Texas Instruments Incorporated under the trademark BowTI™. This is accomplished by using a capillary having a nose or stitch face somewhat in the shape of a figure "8" with a hollow center to carry the wire as in the prior art and with an enlarged but thin walled waist region. A capillary with this shape is still capable of performing the functions of forming and bonding the ball from the wire passing therethrough at one pad and then stitch bonding the wire at a second pad, using the thicker-walled portion of the "8"-shaped capillary The top and bottom portions of the "8" must be used to make the stitch bond because they are thicker and better capable of withstanding the forces applied to the capillary during stitch bonding. With a capillary having the above described shape, bonds are to be made at very closely adjacent bond locations or at designated bond locations where a particular one of two available capillary orientations must be used. These capillary orientations are at an angle of 90° relative to each other so that the circular portion of one capillary fits into but is separated from the waist portion of the adjacent capillary or so that the capillary does not strike some impediment in the travel path. After ball bonding one end of the wire extending from the capillary, the capillary with wire therein is moved to the next bonding location during which time the wire is passed through the capillary. The other end of the wire just bonded is then stitch bonded at the next bonding location, generally a lead finger of a lead frame, using the thicker portions of the capillary. The particular order of the bonds and the determination which bonds will be made by which of the two capillaries is predetermined and stored in a controller which controls the operation of the capillaries and forms no part of this invention. Such controllers are known in the art.

Prior to formation of stitch bonds to the lead frame finger, a clamp is brought down over the lead frame fingers and spaced from the end portions of the lead frame fingers to which the bond will be made to position the lead frame fingers against a support thereunder. Stitch bonds (as well as ball bonds to bond pads on the chips) are then made to the end portions of selected lead frame fingers with the capillary which moves in one of the x-direction or y-direction. The clamp is then moved out of contact with the lead frame fingers, concurrently causing some flexing of the fingers, this being detrimental to the wire loops that have been formed by causing some undesirable movement of the wires away from their desired location. The die is then moved to a second station the lead frame fingers are again clamped and the remaining stitch bonds are then made with the capillary oriented in the other of the two orientations. The clamp is then removed from the lead frame fingers a second time, causing flexing of all of the fingers for a second time. The problems with such flexing are that the wires bonded to the flexed lead fingers tend to sag and/or move sidewise. Due to the very close tolerances available in view of the small dimensions, the possibility of a short circuit or contact with another wire or the like is materially increased.

SUMMARY OF THE INVENTION

In accordance with the present invention, the above described problem caused by flexing of the lead fingers of the lead frame is materially reduced.

Briefly, the clamp initially clamps down either all of the lead fingers of the lead frame or only those lead fingers to which a stitch bond is to be made at the first bonding location. The stitch bonds are then made at the first location in the direction of one of the capillary orientations. The clamp is then removed from all of the clamped lead fingers and the die is moved to the second bonding location. The clamp at the second bonding location now clamps only those lead fingers to which a bond will be made along the second capillary orientation and the bonds are then made. The clamp is now withdrawn and the bonded dies on the die are removed from the bonding region.

It can be seen that either all of the bonded lead fingers undergo only one flexure due to the clamping action or, at worst, those lead fingers bonded in the first bonding location are clamped once and those lead fingers bonded in the second bonding location are clamped twice. Accordingly, there can be as much as a fifty percent reduction in clamping and at least about a 25 percent reduction in clamping in accordance with the present invention, thereby materially reducing the amount of sag and/or other movement of the bonded wires after the bonding operation has been completed.

DESCRIPTION OF THE PREFERRED EMBODIMENT

Figure 1:
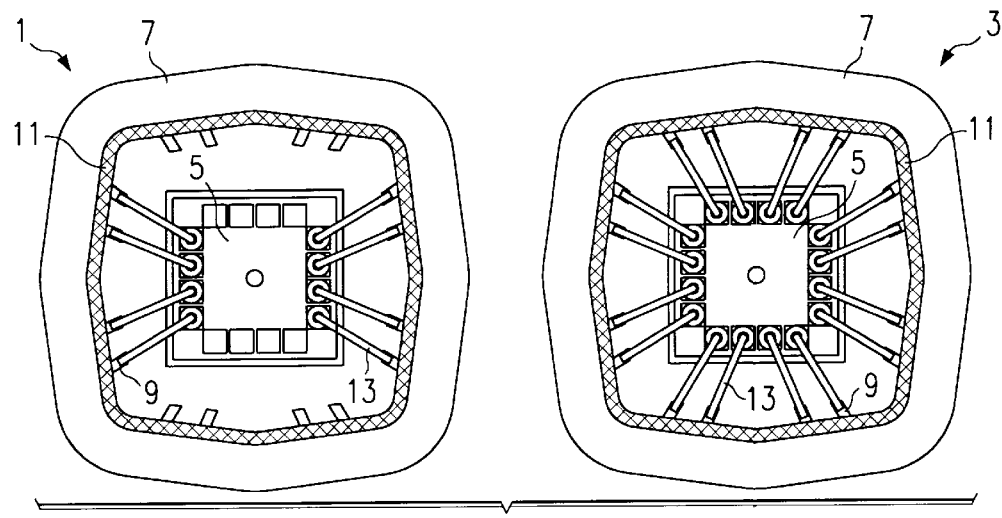
FIG. 1 is a schematic drawing of left and right work stations for bonding wires between bond pads on a die and lead fingers of a lead frame in accordance with the prior art.
Figure 2:
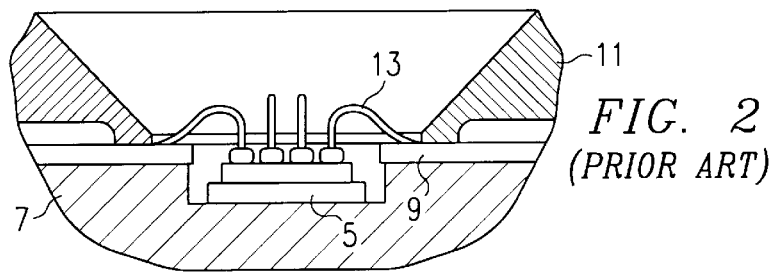
FIG. 2 is a cross sectional drawing of a portion of a work station as shown in FIG. 1.

Referring first to FIG. 1, there is shown a schematic drawing of the left work station 1 whereat bonding will take place with a capillary oriented to bond in the left to right or right to left (x) direction and a work station 3 whereat bonding will take place with a capillary oriented to bond in the top to bottom or bottom to top (y) direction. Initially, the die 5 is positioned in the work station 1 on a clamp window 7 with a lead frame having lead fingers 9 also disposed on the clamp window with the die within the lead fingers. A clamp 11, as better shown in FIG. 2 clamps down all of the lead fingers 9 against the clamp window 7 and bonding then takes place in the "x"-direction to bond wires 13 between bond pads on the die 5 and lead fingers 9. The clamp 11 is raised, allowing the lead fingers 9 to flex from the force applied thereto by the clamp.

The partially wired die is then moved to the right work station 3 whereat bonding will take place with a capillary oriented to bond in the top to bottom or bottom to top (y) direction. The die 5 is positioned in the work station 3 on the clamp window 7 as in the work station 1. A clamp 11 again clamps down all of the lead fingers 9 and bonding takes place in the "y"-direction to bond wires 13 between the remaining bond pads on the die 5 and lead fingers 9. The clamp 11 is again raised, again allowing the lead fingers 9 to flex from the force applied thereto by the clamp. It is apparent that the lead fingers 9 are all flexed twice in accordance with the prior art procedures.

It should be understood that the above described procedure can also take place in a single work station with everything described above being the same except that the die is not moved between work stations. The use of a single work station permits the two capillaries to be operated simultaneously or consecutively.

Figure 3:
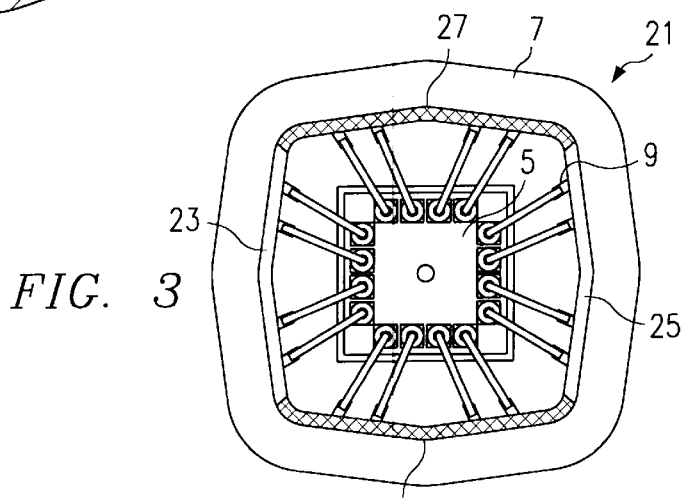
FIG. 3 is a schematic diagram of a work station as used in accordance with the present invention.

With reference to FIG. 3, there is shown a work station in accordance with the present invention wherein only those lead fingers undergoing a bonding operation are clamped or, alternatively, all of the lead fingers are clamped during a first bonding operation and only those lead fingers to which a bond was not previously made are bonded during a second bonding operation. The two bonding operations can be one in the x-direction and one in the y-direction. Also, if the situation dictates, some but not all of the lead fingers to which a bond was made during the first bonding operation can be clamped during the second bonding operation.

Figure 4:
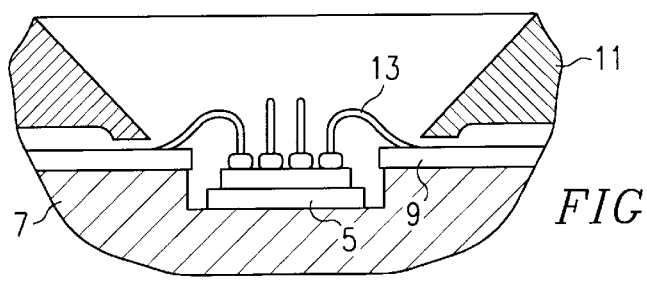
FIG. 4 is a cross sectional drawing of a portion of a work station as shown in FIG. 3.

Initially, the die 5 and lead frame with lead fingers 9 are positioned on the clamp window 7 in the work station 21 as in FIG. 1. Then either all of the lead fingers 9 are clamped by the clamp section 23, 25, 27 and 29 or only those lead fingers to which a bond is to be made during the first bonding operation are clamped by clamp sections 23 and 25 with clamp sections 27 and 27 remaining in the raised position as shown in FIG. 4. The first bonding operation then takes place and the clamp sections 23 and 25 are then placed in the raised position. Then the clamp sections 27 and 29 are lowered if they were previously raised or remain in place if not previously raised and the second bonding operation takes place to bond the remaining bond pads on the die 5 to lead fingers 9. The clamp fingers 27 and 29 are then lifted with the bonding operation now being completed.

It can be seen that the clamping operation, under control of a controller (not shown) causes clamping to take place only once at all lead fingers at best and only once on about half of the lead fingers at worst. Accordingly, the amount of flexure of the lead fingers is minimized as compared with the prior art methods.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of bonding wires comprising the steps of:
    (a) providing a plurality of bonding locations subject to flexure in response to the application of a force thereagainst;
    (b) applying a clamping force against at least a first predetermined subplurality of said bonding locations subject to flexure, the clamping force against the first predetermined subplurality of said bonding locations is applied with a first clamping section;
    (c) forming a wire bond to at least some of said bonding locations of said first subplurality of bonding locations;
    (d) removing said clamping force from said bonding locations to which a bond has been made;
    (e) applying a clamping force with a second clamping section against a second predetermined subplurality of said bonding locations subject to flexure different from said first subplurality;
    (f) forming a wire bond to at least some of said bonding locations; and
    (g) removing said clamping force from said bonding locations.

2. The method of claim 1 wherein said step (c) includes the steps of providing a first capillary and causing said first capillary to perform said step of bonding in a predetermined direction and wherein step (f) includes the steps of providing a second capillary and causing said second capillary to perform said step of bonding in a direction different from said predetermined direction.

3. The method of claim 2 wherein said direction different from said predetermined direction is normal to said predetermined direction.

4. The method of claim 1 wherein said at least a first subplurality includes all of said bonding locations.

5. The method of claim 2 wherein said at least a first subplurality includes all of said bonding locations.

6. The method of claim 3 wherein said at least a first subplurality includes all of said bonding locations.

* * * * *